United States Patent
West et al.

(10) Patent No.: US 12,388,027 B2
(45) Date of Patent: Aug. 12, 2025

(54) SEMICONDUCTOR WAFER SCRIBELANE STRUCTURE

(71) Applicant: TEXAS INSTRUMENTS INCORPORATED, Dallas, TX (US)

(72) Inventors: Jeffrey Alan West, Dallas, TX (US); Elizabeth Costner Stewart, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 489 days.

(21) Appl. No.: 17/833,380

(22) Filed: Jun. 6, 2022

(65) Prior Publication Data

US 2023/0282595 A1    Sep. 7, 2023

Related U.S. Application Data

(60) Provisional application No. 63/315,658, filed on Mar. 2, 2022.

(51) Int. Cl.
*H01L 23/544* (2006.01)
*H01L 21/78* (2006.01)

(52) U.S. Cl.
CPC ............ *H01L 23/544* (2013.01); *H01L 21/78* (2013.01); *H01L 2223/5446* (2013.01)

(58) Field of Classification Search
CPC .................. H01L 23/544; H01L 21/78; H01L 2223/5446; H01L 22/32; H01L 23/585; H01L 23/562
See application file for complete search history.

(56) References Cited

U.S. PATENT DOCUMENTS

| | | | |
|---|---|---|---|
| 5,981,302 A | 11/1999 | Alswede et al. | |
| 8,125,053 B2 | 2/2012 | West et al. | |
| 8,309,957 B2 | 11/2012 | Chatterjee et al. | |
| 8,975,162 B2 | 3/2015 | Lei et al. | |
| 10,157,861 B2 | 12/2018 | Jackson et al. | |
| 10,685,883 B1 * | 6/2020 | Wei ....................... | H01L 23/544 |
| 10,879,206 B1 * | 12/2020 | Wu ......................... | H01L 24/13 |
| 2002/0000642 A1 * | 1/2002 | Lin ......................... | H01L 22/32 |
| | | | 257/E23.179 |
| 2003/0122220 A1 | 7/2003 | West et al. | |
| 2004/0207383 A1 | 10/2004 | Wang | |
| 2008/0169533 A1 * | 7/2008 | Jeng ....................... | H01L 23/562 |
| | | | 257/E23.179 |
| 2010/0072578 A1 * | 3/2010 | Kunishima .......... | H01L 23/585 |
| | | | 257/E23.179 |

(Continued)

OTHER PUBLICATIONS

Provisional Opinion, PCT Application No. PCT/US2023/014055, 6 pages, mailed Jul. 25, 2023.

(Continued)

*Primary Examiner* — Victor A Mandala
(74) *Attorney, Agent, or Firm* — Andrew R. Ralston; Frank D. Cimino

(57) ABSTRACT

An integrated circuit (IC) fabrication flow including a multilevel metallization scheme wherein one or more metal layer members of a scribelane structure are formed according to one or more design constraints. A total thickness of the metal layer members of the scribelane structure along a dicing path may be limited to a threshold value to optimize dicing separation yields in a dicing operation.

20 Claims, 14 Drawing Sheets

(56) References Cited

U.S. PATENT DOCUMENTS

| | | | |
|---|---|---|---|
| 2010/0133669 A1* | 6/2010 | Jao | H01L 23/562 |
| | | | 257/E23.18 |
| 2010/0289021 A1 | 11/2010 | Wu | |
| 2011/0287627 A1 | 11/2011 | Chen et al. | |
| 2012/0126228 A1* | 5/2012 | Fischer | H01L 23/562 |
| | | | 257/E23.179 |
| 2014/0167199 A1* | 6/2014 | Cheng | H01L 23/585 |
| | | | 257/443 |
| 2016/0133580 A1 | 5/2016 | Bonifield et al. | |
| 2017/0345772 A1* | 11/2017 | Jackson | H01L 21/78 |
| 2019/0181063 A1* | 6/2019 | Liao | H01L 23/544 |
| 2020/0312715 A1* | 10/2020 | Choi | H01L 21/76838 |
| 2021/0217706 A1* | 7/2021 | Jackson | H01L 23/3192 |
| 2023/0013898 A1* | 1/2023 | Zhang | H01L 22/34 |
| 2023/0041160 A1* | 2/2023 | Huang | H01L 23/564 |

OTHER PUBLICATIONS

Form PCT/ISA/206, mailed Jul. 25, 2023.
Annex to Form PCT/ISA/206, mailed Jul. 25, 2023.

\* cited by examiner

SEMICONDUCTOR WAFER SCRIBELANE STRUCTURE

CROSS-REFERENCE TO RELATED APPLICATIONS

This non-provisional application claims priority based upon U.S. provisional Application No. 63/315,658, filed Mar. 2, 2022, which is hereby incorporated by reference in its entirety.

FIELD OF THE DISCLOSURE

Disclosed implementations relate generally to the field of semiconductor fabrication. More particularly, but not exclusively, the disclosed implementations relate to a semiconductor wafer scribelane structure and the fabrication of a semiconductor wafer having one or more scribelane structures disposed in a scribelane.

BACKGROUND

Integrated circuit substrates, such as silicon wafers, may contain test structures and circuits between the integrated circuits disposed on respective active dies. In some arrangements, example test structures may include electrical probe pads. Dicing operations for separating the integrated circuits may cut through the electrical probe pads. Cracks may propagate in the substrate from diced edges of the substrate toward the integrated circuits.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to an integrated circuit (IC) fabrication flow including a multilevel metallization scheme wherein one or more metal layer components of a scribelane structure are formed according to one or more design constraints. A total thickness of the metal layer components of the scribelane structure along a dicing path may be limited to no greater than a value predetermined to mitigate the damage to the substrate that may be caused in a dicing operation.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Figure 1:
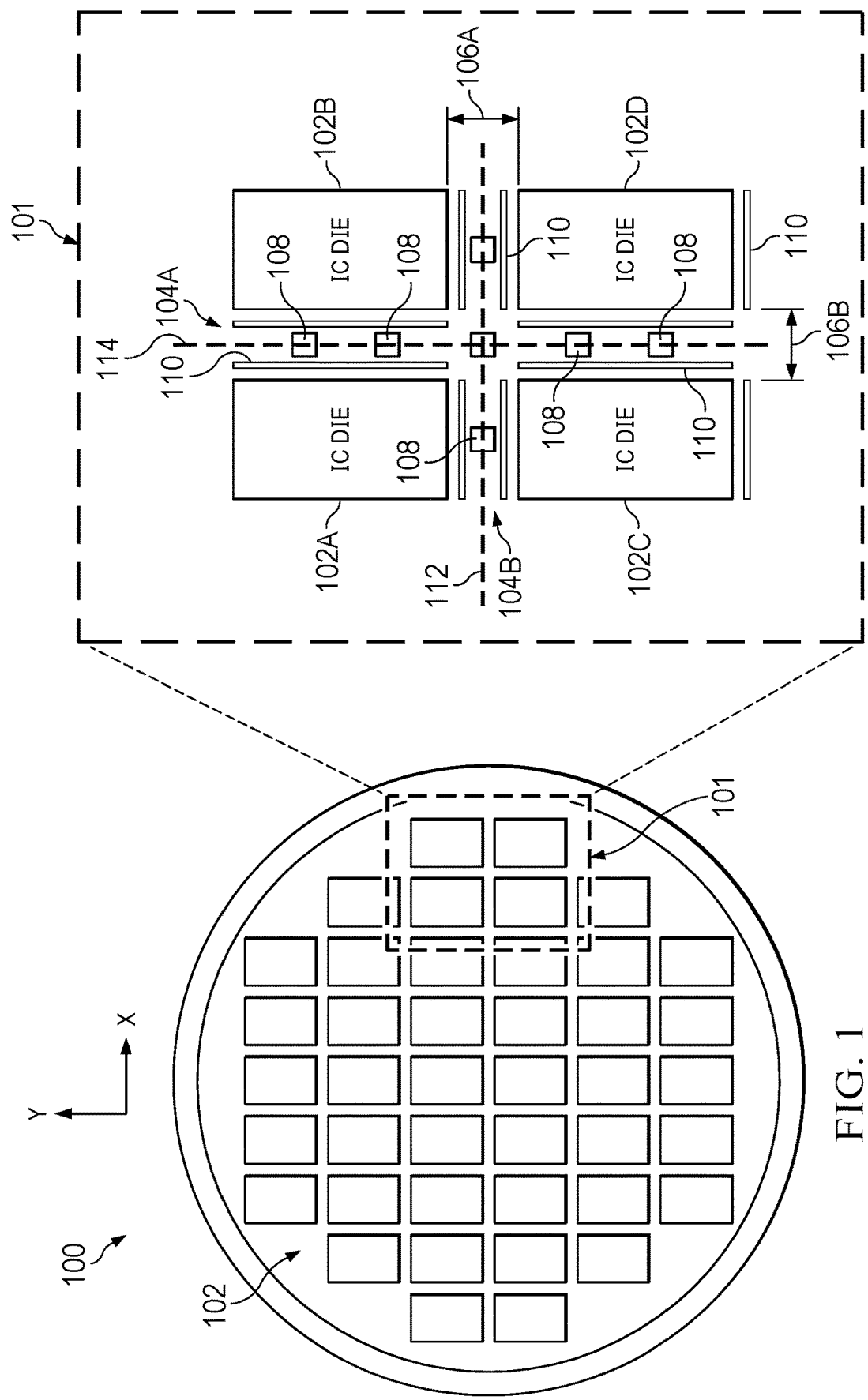
FIG. 1 depicts a semiconductor wafer having a plurality of IC chips or dies surrounded by one or more scribelane structures formed in a scribelane according to some examples of the present disclosure.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components, structures or subsystems, etc.

The term "coupled" may include connections made with intervening elements, and additional elements and various connections may exist between any elements that are "coupled."

The terms "scribelane" and "scribe lane" may include terms of similar import such as "scribe street", "scribe line", etc., and refer to areas on a semiconductor wafer between adjacent integrated circuit (IC) dies (also referred to as "chips", "dies", "device dies", "ICs" or "IC chips", or terms of similar import) that are set aside for facilitating physical separation of the IC dies (i.e., singulation) in a dicing operation.

Various disclosed methods and devices of the present disclosure may be beneficially applied to integrated circuit manufacturing by reducing the amount of metal that is removed when ICs are singulated. Excess metal may dull or clog a saw blade, or may propagate damage into the device area during laser dicing. Described examples may be expected to increase separation yield, but no particular result is a requirement unless explicitly recited in a particular claim.

In semiconductor fabrication processes, wafer dicing plays an important role in the quality of the product, e.g., singulated IC chips, before packaging. Baseline methods for dicing wafers such as, e.g., blade or saw dicing, pulverize the wafer material in the cutting path (known as "dicing street", "kerf" or "kerf lane", or terms of similar import) disposed in the scribelane of the semiconductor wafer. In doing so, some example baseline techniques can cause issues such as debris, damage to the circuitry of IC chips due to, e.g., cracks, as well as loss of valuable semiconductor wafer real estate. Laser dicing offers several advantages over mechanical dicing operations, especially for IC chips having small form factors (e.g., less than around 1.0 mm$^2$), as it enables significant cost savings by facilitating a reduction both in the widths of scribe seal structures surrounding the active die area as well as a reduction in the total scribelane widths required. However, laser dicing separation yield (defined as functional separated die per wafer) may be degraded when dicing through scribelane features and structures that comprise several metal layers (e.g., in a metal stack) having a total metal thickness that exceeds a certain threshold, which may vary depending on the IC product type, the composition(s) and thickness(es) of respective metal layers, inter-metal dielectrics, as well as other process flow considerations.

The present disclosure sets forth examples of a flow that includes a metallization design scheme for fabricating a variety of components and features disposed in the scribelane of a semiconductor wafer (collectively referred to as scribelane structures) that are "dicing-friendly", which may be provided as part of any semiconductor fabrication flow for mitigating the collateral damage in dicing operations, thereby improving dicing separation yields. Although example implementations are described in particular detail with reference to electrical test pad or probe pad structures disposed in a scribelane, it should be appreciated that the teachings herein may be equally applied, mutatis mutandis, to other scribelane structures such as, e.g., photo alignment marks, alignment measurement boxes, chemical mechanical polishing (CMP) test structures, critical dimension (CD) control marks, etc., that may be implemented in an example process flow to monitor the integrity of the various process flow stages involved. Further, whereas some examples are set forth in detail with respect to laser dicing, the teachings herein are not necessarily limited thereto.

Referring to the drawings, FIG. 1 depicts a top plan view of a semiconductor wafer 100 having a plurality of IC chips or dies 102 formed in or over a semiconductor substrate in a grid-like pattern, wherein IC dies 102 may be surrounded by one or more scribelane structures that may be formed in a scribelane surrounding an IC device area according to some examples of the present disclosure. For purposes of the present disclosure, semiconductor wafer 100 may also be referred to as a semiconductor process wafer or simply a process wafer, handle wafer or wafer in some examples. By way of illustration, IC dies 102A-102D are shown as an array 101, each IC die separated from other dies by one or more scribelanes formed in wafer 100, e.g., scribelanes 104A, 104B, wherein each scribelane 104A, 104B has a respective width 106A, 106B and extend laterally in the plane of the wafer 100 along respective directions that are orthogonal to each other. As shown, scribelane 104A extends along a first direction parallel to a first axis of an X-Y Cartesian coordinate system, e.g., X-axis, whereas scribelane 104B extends along a second direction parallel to a second axis orthogonal to the first axis of the X-Y coordinate system, e.g., Y-axis. In some examples, scribelanes 104A, 104B may have the same width. In some examples, scribelanes 104A, 104B may each have a different width. Depending on implementation and the dicing technologies involved, the scribelane widths may vary from a few tens of microns (e.g., for laser dicing operations) to a few hundreds of microns or more (e.g., for mechanical dicing operations) in order to support the required cutting lane (i.e., kerf lane) widths. In some examples, protective structures such as, e.g., scribe seals 110, may be formed in one or more scribelanes 104A/104B as an optional implementation, which may be located proximate to or associated with one more edges of IC dies 102A-D in order to arrest or otherwise minimize the propagation of cracks or fissures that may be generated in the semiconductor substrate during a dicing operation. It is not necessary, however, for purposes of the present disclosure to have scribe seals as will be seen below with reference to some example implementations.

A plurality of scribelane structures 108 may be formed in one or more scribelanes 104A, 104B, wherein scribelane structures 108 may have a variety of 3-dimensional (3D) form factors, e.g., having lateral or horizontal dimensions along X- and Y-axes as well vertical heights or thicknesses, and may be disposed at several locations in scribelanes 104A, 104B depending on the example process flow and/or device design. Further, an example scribelane structure 108 may comprise a plurality of conductor layers, e.g., metal layers separated by inter-metal dielectric layers, wherein a metal layer may be in an electrically conductive relationship with one or more overlying and/or underlying metal layers by way of one or more metal-filled vias. Still further, example scribelane structures 108 may comprise one or more metal layers that may be electrically connected to one or more electrical nodes of a test device formed in the scribe lane for in-line or end-of-line characterization. Such test devices may include various active and passive components, e.g. transistors such as bipolar junction transistors (BJTs), metal oxide semiconductor (MOS) field effect transistors (MOSFETs), diodes, microelectromechanical systems (MEMS), nanostructures, silicon controlled rectifiers, and other devices that conduct current in response to a voltage or current, as well as capacitors, resistors, and inductors, etc, depending on the intended functionality of a scribelane structure. In some arrangements, example scribelane structures 108 are configured to monitor process flow integrity, e.g., alignment integrity, CD compliance, planarization compliance/integrity, etc., and may comprise metal layers that may not be electrically connected to any circuit components such as described previously. In some arrangements, the metal layers and any inter-level vias, if present, of an example scribelane structure 108 may be formed concurrently with one or more metal interconnect layers and via layers formed in IC dies 102 during fabrication. Likewise, the dielectric layers of an example scribelane structure 108 may be formed concurrently with one or more dielectric layers formed in IC dies 102 at various stages of a process flow.

Regardless of the type and/or function, scribelane structures present resistance in a dicing operation (e.g., during the cutting process itself and/or during post-cutting mechanical separation) that can negatively impact yield. In general, the metal stack layers of a scribelane structure may act as a crack suppression/resistance component that counteracts the separation forces generated in dicing, e.g., in laser dicing. In some arrangements, dicing separation yield may be empirically related to a total metal thickness of a scribelane structure encountered in a dicing path (e.g., dicing paths 112, 114 parallel to the X- or Y-coordinates, respectively). In some arrangements, dicing separation yield may also be empirically related to a lateral dimension of a metal component or member of the scribelane structure measured linearly along the dicing path. Example implementations herein set forth a scheme for forming metallization layers in a metal stack of scribelane structures based on one or more design rules that may be employed in various permutations and combinations as will set forth in further detail below.

Broadly, example implementations provide a structural design framework configured to reduce overall counteracting mechanical forces exerted or experienced by scribelane structures during wafer dicing operations while adhering to a set of design rules or constraints that may be empirically determined depending on IC product types, process flows, metal compositions, etc. Some examples may involve a design modification for all scribelane structures for which the total metal stack thickness exceeds a threshold (e.g., a threshold above which is determined to cause a certain amount of loss in the dicing separation yield) so as to bring the total metal stack thickness below the threshold. By way of illustration, a baseline process flow may have scribelane structures with a total metal stack thickness exceeding $MET_{TotTh}$ microns (μm), wherein the scribelane structures are determined to cause a separation yield loss, e.g., 5%, 10%, etc. An example arrangement may therefore implement a design architecture wherein the total metal stack thickness of the scribelane structures is less than or equal to $MET_{TotTh}$ μm. As used herein, "$MET_{TotTh}$" or "total metal stack thickness" is defined as the sum of all metal layers intersecting a reference axis normal to the top surface of the underlying substrate. This is described further with reference to FIG. 5, infra. Because the linear dimensions of scribelane structures or their components along a dicing path may also affect the dicing separation yield, another design rule may involve limiting the foregoing "thickness limiting" design rule only to scribelane structures or components thereof having a certain minimum length, which may also vary depending on implementation. A representative arrangement may therefore involve applying a thickness limiting design rule (e.g., a total metal stack thickness being less than or equal to $MET_{TotTh}$) only to scribelane structures/components having a continuous length exceeding a threshold length ($L_{Min}$) measured along the dicing path, e.g., 10 μm, 15 μm, etc.

In some example arrangements, a thickness limiting design rule may be implemented by providing a "hollow frame" design for one or more metal layer components forming a multilevel metal stack of a scribelane structure. In some example arrangements, a hollow frame design may be implemented only for certain metal layers having a minimum thickness, e.g., >1.0 μm, 1.5 μm, etc. In some arrangements, a hollow frame design may be implemented only for a subset of the layers forming the multilevel metal stack of a scribelane structure so long as an applicable $MET_{TotTh}$ constraint is satisfied. In some arrangements, a hollow frame design may be implemented only for components of a scribelane structure located at an intermediate level metal layer, e.g., below a top-level metal layer. For example, in an electrical test pad structure having a plurality of metal layers wherein a top level metal (TLM) layer forms a portion that needs to make electrical contact to a structure, e.g., a probe for testing, it may be desirable to not implement a hollow frame design for the top level metal layer so that satisfactory ohmic contact properties during inline testing are maintained.

Figure 6:
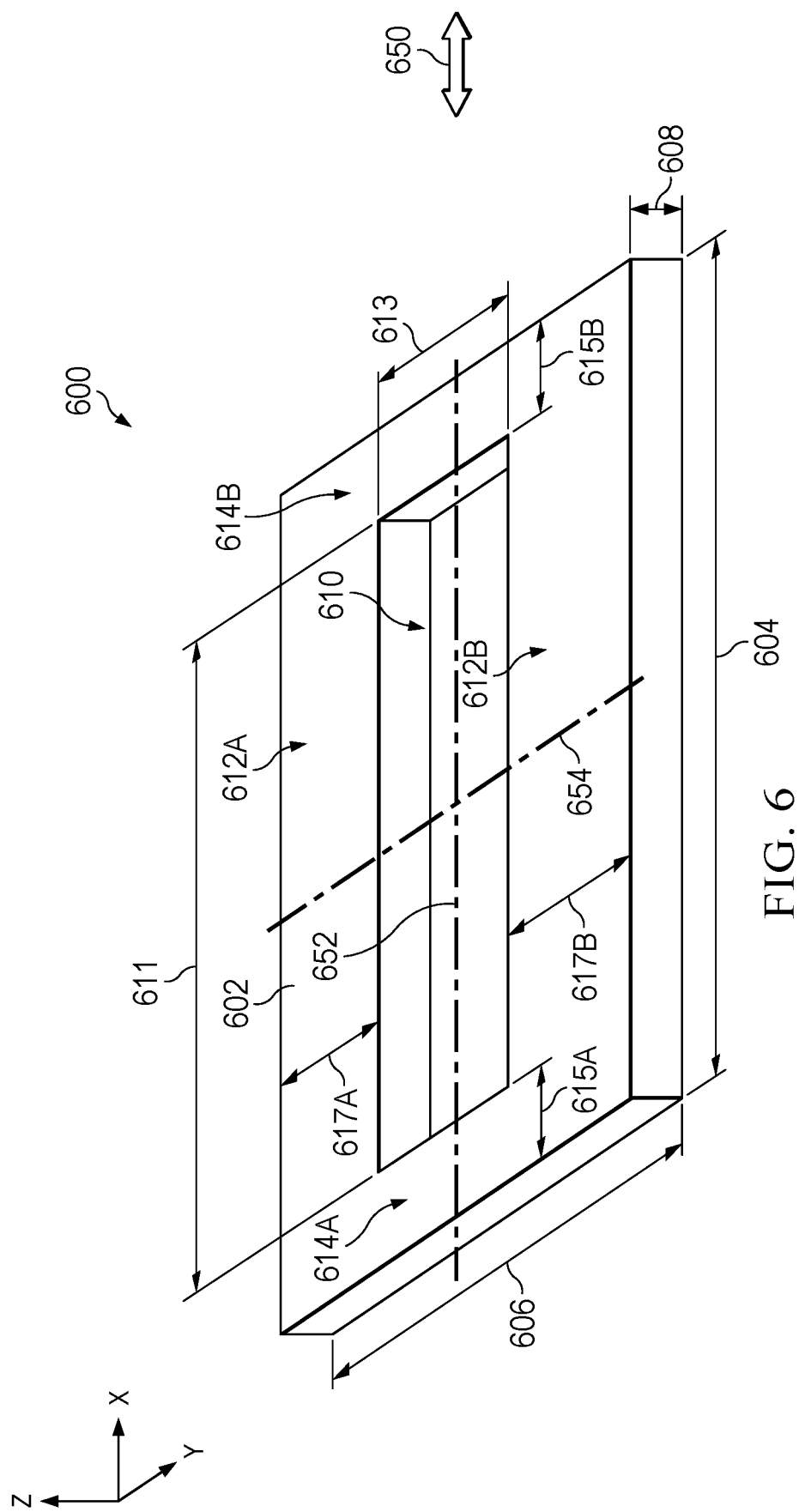
FIG. 6 depicts an example hollow frame metal layer component that may be provided as part of a multilayer metal stack in a scribelane structure configured according to some examples of the present disclosure.

FIG. 6 depicts an example hollow frame metal layer component that may be provided as part of a multilayer/multilevel metal stack in a scribelane structure configured to mitigate damage in a dicing operation according to some examples of the present disclosure. Example metal layer component 600 includes a frame 602 surrounding a circumscribed area 610, wherein frame 602 and circumscribed area 610 may be configured in various ways depending on implementation. In one arrangement, frame 602 may comprise a rectangular form having a pair of longitudinal members 612A, 612B and a pair of transverse members 614A, 614B formed as a unitary construct (e.g., integrally coupled) in a metallization step (e.g., in a back-end-of-line (BEOL) process). In one arrangement, frame 602 may be formed as part of a multilevel metallization/interconnection fabrication process using any known or heretofore unknown metallurgies and technologies, e.g., non-damascene processes, hybrid metallization processes, single- or dual-damascene processes, etc. that may involve various metals and metal compositions such as aluminum, copper, respective alloys, and the like. Herein the term "non-damascene" as applied to a metal layer means that metal layer is formed by other than a damascene process, such as by subtractive etch of an initial blanket metal layer. In some arrangements, an example metallization scheme may also include barrier metal layers, metal adhesion layers, etc. Frame 602 may have a length 604, a width 606, and a thickness 608, wherein longitudinal members 612A/612B and transverse members 614A/614B may each have respective widths that may be the same or different in some arrangements. Depending on the scribelane structures involved, length 606 and width 606 may each vary from a few tens of microns to several tens of microns in size. Without limitation, example electrical test pad structures may be 50 μm or more in both X- and Y-directions in some implementations. In an example arrangement, longitudinal members 612A, 612B are disposed parallel to each other and transverse members 614A, 614B are disposed parallel to each other. In one example implementation, frame 602 may be configured to be bilaterally symmetric around a longitudinal axis 652 and/or a transverse axis 654, wherein axes 652 and 654 are orthogonal to each other and disposed parallel to X- and Y-axes of a Cartesian coordinate system in the plane of the top surface of the underlying substrate. It is not a requirement, however, that an example frame 602 be constructed with either of the bilateral symmetries.

In an example implementation, circumscribed area 610 surrounded by frame 602 may have a rectangular shape although other shapes may also be realized in some additional and/or alternative arrangements. Where implemented as having a rectangular shape, circumscribed area 610 may have a length 611 and a width 613 (which may be referred to as interstitial length and width, respectively, in some arrangements) that may be dimensioned in accordance with certain minimum distance/spacing requirements as will be set forth below.

As illustrated, widths 617A, 617B represent the widths of longitudinal members 612A, 612B, respectively. Similarly, widths 615A. 615B represent the widths of transverse members 614A, 614B, respectively. As for the dimensions of interstitial length 611 and width 613, widths 615A/615B and 617A/B may be implementation-specific, whose dimensions may vary depending upon other dimensions and design rules as well as kerf lane requirements. Further, electrical performance requirements with respect to certain scribelane structures may impose further minimum spacing requirements relative to widths 615A/615B and 617A/B. For example, to ensure that frame 602 implemented in a test pad structure supports adequate electrical current and/or current density requirements with respect to signal propagation and/or power supply levels, metallic members 612A/612B and 614A/614B may be required to have at least a threshold width, e.g., around 3 µm, 4 µm, etc., which may vary based on applicable design rules. In some arrangements, for instance, metal enclosure rules pertaining to vias may specify the width at a certain minimum value. Also, a maximum limit may be imposed based on a metal dimension along a dicing path that should be no more than a certain length for laser dicing. In other words, the smallest dimension of a frame's width should be greater than the threshold width required for meeting the electrical performance parametrics of an IC design while satisfying other relevant design constraints depending on implementation.

In one arrangement, metal layer component 600 may be oriented such that a dicing path 650 may be configured to intersect frame 602 longitudinally, i.e., along longitudinal axis 652. Accordingly, whereas longitudinal members 612A, 612B may be disposed substantially parallel to dicing path 650, transverse members 614A, 614B may be disposed substantially perpendicular to dicing path 650. Although dicing path 650 may be configured to be a straight line, there may be a certain amount of meandering of the actual cutting path in a dicing operation (e.g., a deviation from the exact center of a kerf lane). Further, the amount of meandering may vary depending on process tooling. In an example implementation, to ensure that a dicing path remains within circumscribed area 610, thereby benefiting from the reduced cutting resistance due to the removal of interior metal, interstitial width 613 of circumscribed area 610 may be suitably dimensioned for accommodating any dicing path meandering. In some example arrangements, interstitial width 613 of circumscribed area 610 may range 5 µm to 15 µm, although other widths (e.g., smaller or larger) may also be implemented in accordance with the teachings herein.

Whereas frame width (e.g., widths 615A, 615B, 617A or 617B) on any side of circumscribed area 610 of metal layer component 600 may be configured to be greater than a minimum width in order to meet a design's electrical performance requirements, the frame width should be less than a maximum length measured along the dicing path in order to avoid and/or mitigate extra cutting resistance. Accordingly, widths 615A, 615B of transverse members 614A, 614B, which are disposed orthogonal to dicing path 650, may be configured to have a width greater than what is required for satisfying the electrical performance requirements, but limited to less than or equal to a maximum length, e.g., 10 µm, 15 µm, etc., in some implementations. On the other hand, widths 617A, 617B of longitudinal members 612A, 612B are not in the cutting path, and therefore may be configured to have larger widths, albeit subject to the requirements of interstitial width 613 as noted above as well as the total scribelane width requirements between adjacent dies, which may be balanced relative to overall width 606 of metal layer component 600 in some example arrangements. Accordingly, in view of the foregoing flexible yet interplaying design considerations, an example scribelane structure may be configured with a metal layer component having a frame containing an interior circumscribed area that may have a variety of shapes or geometries, e.g., including curvilinear contours, straight lines, zagged lines, and/or any combination thereof, as long as the applicable design constraints are met.

It will be recognized that a scribelane structure may be fabricated using a design framework having any combination and/or subcombination of the foregoing design considerations, wherein one or more metal layers of a scribelane structure may be formed as a hollow frame design as set forth herein. Where two or more metal layer components of a scribelane structure are provided as hollow frame designs, they each may have different frames, e.g., different frame shapes, frame thicknesses, frame widths, frame lengths, different shapes of interstitial circumscribed areas and widths, etc., wherein each frame design of a metal layer component may be individually configured to comply with one or more applicable design rules described above, recognizing that different design rules may apply to different metal layers.

As previously noted, scribelane structures including multilayer metal components/members, as well as any inter-level vias, e.g., based on tungsten metallurgies and the like, may be fabricated concurrently with one or more metal interconnect layers and via layers formed in a BEOL multilevel metallization stage involving various process steps such as lithography, deposition, etch, etc., wherein a plurality of masks may be used for forming a corresponding number of metal layers. A plurality of inter-metal dielectric (IMD) or inter-level dielectric (ILD) insulator layers may be provided in an example BEOL flow, wherein one or more ILD/IMD layers or sublayers having varying compositions and/or thicknesses may be formed between two adjacent metal layers depending on implementation. Accordingly, interstitial circumscribed areas of hollow frame metal layer components of a scribelane structure may be filled with various dielectrics or insulator materials based on an example process flow. In some arrangements, mask layers corresponding to metal layer components of a scribelane structure that are determined to have a hollow frame design may be designed such that a hollow frame is formed rather than solid (or, continuous) sheets of metal for those metal layer components. In another implementation, a solid metal layer component may be formed first (e.g., using a baseline masking process without any mask layer modification), which may be patterned subsequently using another masking process to remove metal from a defined region to form an interior circumscribed area, thereby creating a hollow frame.

In some example implementations, it may be desirable to not have inter-level vias (e.g., tungsten plugs) in a dicing path so as to further mitigate or reduce crack formation/propagation. Accordingly, in an example scribelane structure, vias may be formed only on the longitudinal members of a hollow frame metal layer component of the scribelane and not on the transverse members. As a further variation, a "via free" region may be defined with respect to the transverse members of a hollow frame metal layer component, e.g., within a predetermined distance from the dicing path. In such an arrangement, vias may be formed on the transverse members only outside of the via free region(s). In some implementations, a via free region may be defined relative to a dicing path, e.g., ±2.5 µm, ±5.0 µm, etc. from the dicing path, which may coincide with a longitudinal axis of the hollow frame metal layer component.

In some example arrangements, a protective overcoat (PO) formed over a semiconductor process wafer may be patterned in a suitable PO removal (POR) process, wherein one or more slots having a predetermined width and depth may be formed in the PO layer that coincide or align with the scribelane of the semiconductor process wafer in order to further mitigate or reduce cutting path meandering and/or crack formation/propagation during dicing operations. Depending on implementation, a PO dielectric layer may have a total thickness of several tens or hundreds nanometers (nm) to several microns that may include one or more layers or sublayers of insulator materials such as, e.g., silicon nitride, silicon oxide, oxynitride, polyimide, etc. that may be overlain as part of a BEOL process flow. In general, IC chips designed to operate with higher voltages may require thicker POs. In one implementation, a PO layer may be planarized before slot patterning so as to better align the PO slots with the scribelane grid of the semiconductor process wafer. Depending on implementation, POR slots may be continuous or discontinuous, and may span across the entire scribe lane or formed in only select portions thereof. In some arrangements, an POR slot may have a width of, e.g., about 1 μm-20 μm, and may have a depth of about several ones or tens of nanometers. In some arrangements, POR slots may be formed concurrently with the formation of pad/contact openings in a process flow.

Figure 7:
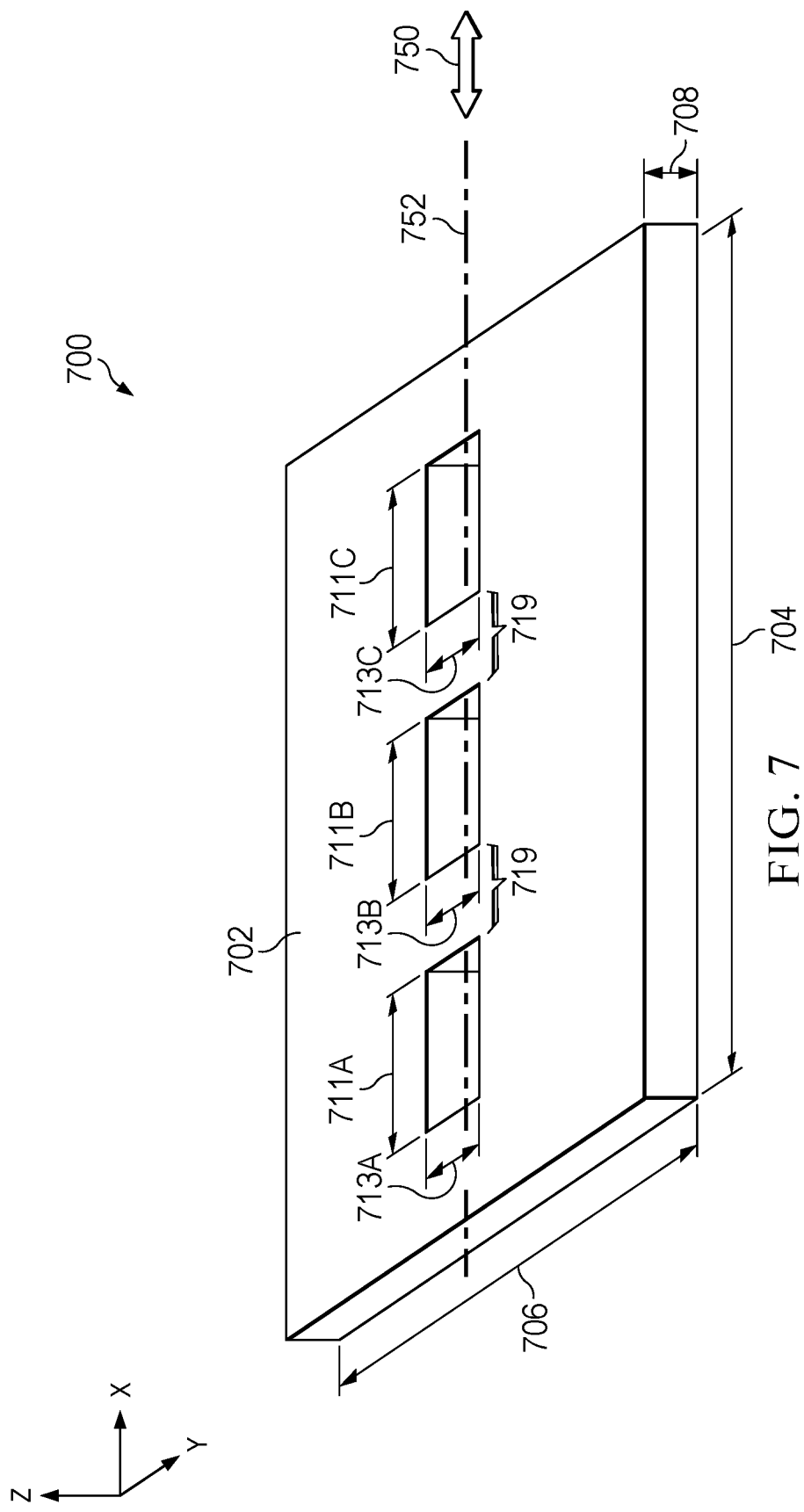
FIG. 7 depicts an example metal layer component having a plurality of perforations or slots that may be provided as part of a multilayer metal stack in a scribelane structure configured according to some examples of the present disclosure.

In some variations, instead of having a single continuous interior circumscribed area surrounded by a frame for a metal layer component of a scribelane structure, a plurality of openings or perforations that are longitudinally aligned may be formed in a metal layer for mitigating crack formation/propagation during dicing operations. Turning to FIG. 7, depicted therein is an example metal layer component 700 having a plurality of perforations or slots that may be provided as part of a multilayer metal stack in a scribelane structure according to some examples of the present disclosure. Metal layer component 700 comprises a perforated sheet 702 wherein a plurality of openings, slots, perforations, apertures, or like features, etc., exemplified as openings 710A-710C, may be formed in a BEOL metallization process similar to some examples set forth above. Although rectangular openings 710A-710C are illustrated, it should be appreciated that openings of different shapes and/or sizes may also be provided in some additional or alternative arrangements so long as they are aligned substantially longitudinally along a dicing path 750 that coincides with a longitudinal axis 752 and various applicable design constraints set forth in the present disclosure are satisfied, mutatis mutandis. The perforated sheet may be viewed as multiple frames, with adjacent frames sharing a common transverse member.

Perforated sheet 702 may have a length 704, a width 706, and a thickness 708, which may be suitably dimensioned depending on implementation. By way of illustration, openings 710A-710C have respective lengths 711A-711C and respective widths 713A-713B. Similar to the design constraints set forth above with respect to circumscribed area 610, widths 713A-713B of openings 710A-710C may be provided with a range of sizes, e.g., 5 μm to 15 μm, to account for cutting path meandering although other widths may also be implemented in some variations. Inter-perforation metal spacing 719 between two adjacent perforations may be variable, subject to the minimum and maximum spacing constraints described above. In some arrangements, therefore, metal remaining on any side of a perforation may be at least 3.0 μm, while inter-perforation metal spacing 719 along the dicing path may be no more than a maximum length, e.g. 10 μm, 15 μm, etc.

Figure 5:
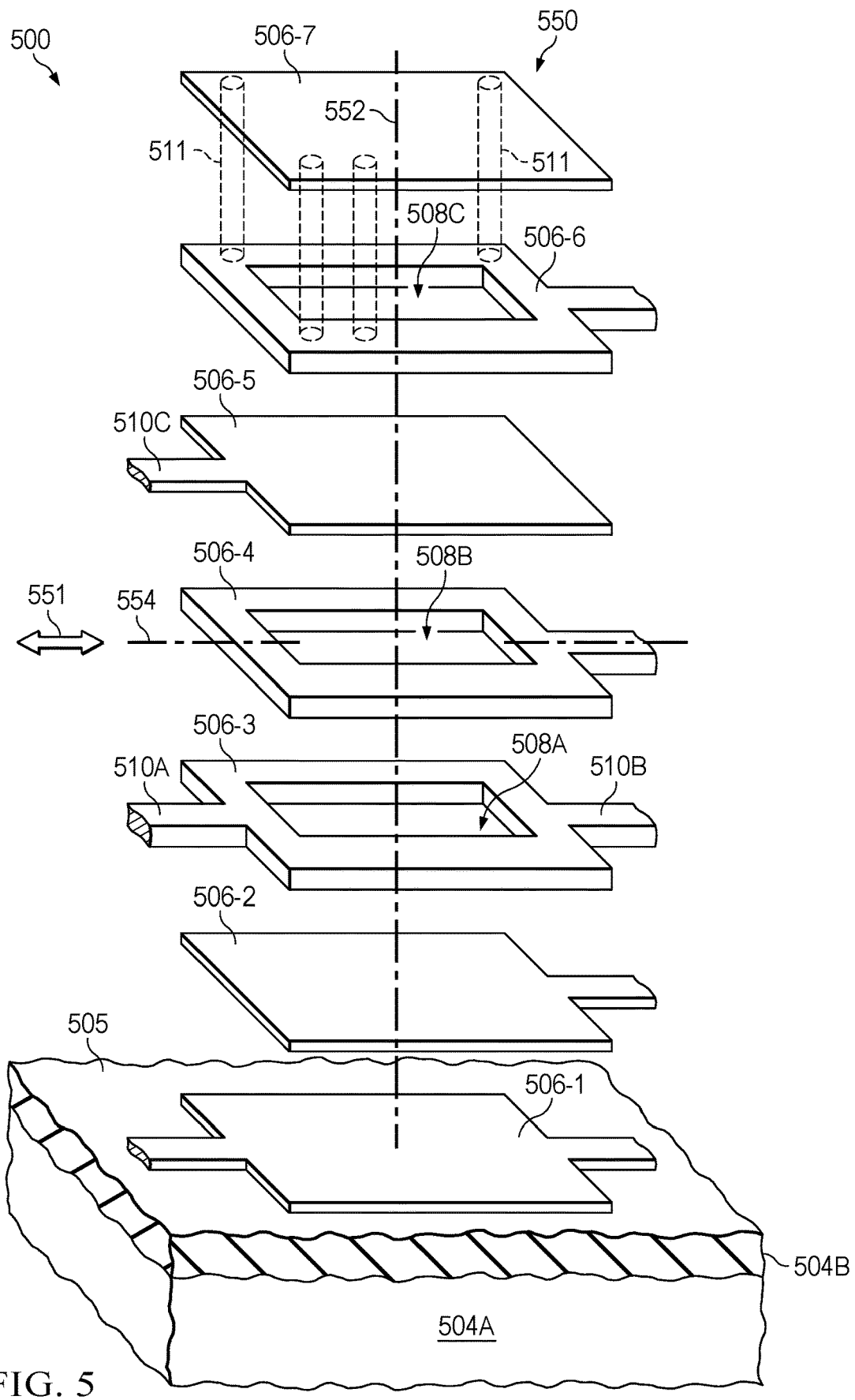
FIG. 5 depicts a semiconductor wafer portion illustrating a simplified 3-dimensional (3D) view of a test pad structure formed as a scribelane structure having a multilayer metal stack according to some examples of the present disclosure.

FIG. 5 depicts a semiconductor wafer portion illustrating a simplified 3-dimensional (3D) view of a test pad structure formed as a scribelane structure having a multilayer metal stack according to some examples of the present disclosure.

Example wafer portion 500 may include a substrate 504A of suitable semiconductor materials such as, e.g., Si, Ge, GaAs, SiC, GaN, other Group III-V materials, etc. wherein various individual devices (e.g., transistors, diodes, capacitors, resistors, etc., not specifically shown in this FIG.) may be formed in a front-end-of-line (FEOL) portion of a fabrication flow. In some implementations, a pre-metal dielectric (PMD) layer 504B may be formed over the devices at the end of FEOL processing. In one arrangement, wafer portion 500 may exemplify a semiconductor substrate portion disposed between two IC dies formed in a wafer, thereby defining a scribelane portion 505. A multilevel metallization/interconnection fabrication process may be implemented in a BEOL portion of the fabrication flow, wherein a plurality of metal conductor layers and corresponding dielectric insulator layers may be formed as previously noted. In addition to interconnecting the various individual devices of the IC dies, a multilevel metal stack 550 having a plurality of metal layer components, e.g., components 506-1 to 506-7, may be formed over scribelane portion 505 in the BEOL process flow for operating as a test pad structure. This illustrative example may be representative of a process technology that uses seven metal interconnect levels. For the sake of clarity, no dielectric insulator layers are shown between metal layer components 506-1 to 506-7 of metal stack 550, wherein one or more metal layer components may have conductive connectors with varying widths extending therefrom horizontally along X- and/or Y-axes in either lateral directions in order to provide connectivity to various electrical nodes of an IC die depending on the testing and monitoring functionality of the test pad structure. By way of illustration, metal layer component 506-3 is shown as having connectors 510A, 510B laterally extending therefrom. Likewise, metal layer component 506-5 is shown as having connector 510C laterally extending therefrom. A longitudinal axis 554 associated with metal stack 550 may be aligned with a dicing path 551 during dicing operations. One or more metal members of metal stack 550 may be formed as thin layers. Further, one or more metal members of metal stack 550 may be formed as thick layers or ultra thick layers. Depending on the location in metal stack 550, some metal layers may be upper metal layers, some metal layers may be lower metal layers, and some metal layers may be intermediate-level metal layers. In some implementations, layers having a thickness of <1.0 μm may be considered thin layers, layers having a thickness of ≥1.0 μm may be considered thick layers, and layers having a thickness of ≥6.0 μm may be considered ultra thick layers. In some example implementations, it is expected that the thick layers and ultrathick layers (generally corresponding to global interconnect layers of an IC chip) are ones that contribute the most to the die separation yield reduction during dicing operations. Accordingly, in some arrangements all or at least a portion of the thick/ultra thick metal layer components in metal stack 550 may be provided with a hollow frame design and/or a perforated sheet design in accordance with the examples set forth hereinabove. By way of illustration, metal layer components 506-3, 506-4, 506-6 are shown as having a circumscribed area 508A, 508B, 508C in a respective hollow frame design. A total metal layer thickness of stack 550 is therefore a sum of the thicknesses of a top metal layer component 506-7 and intermediate or lower level metal layer components 506-5, 506-2, 506-1. Because of the removal of metal in circumscribed areas 508A, 508B, 508C, the total metal layer thickness of stack 550 (not including the thicknesses of the dielectric insulator layers) measured along a vertical axis 552 passing through circumscribed areas 508A, 508B, 508C may therefore be reduced to a value that is less than an upper limit value that may be empirically determined as noted previously. As a further example, illustrative vias 511 may be optionally provided between top metal layer component 506-7 and lower metal layer component 506-6, wherein vias 511 are disposed on longitudinal sides of the hollow frame forming lower metal layer component 506-6. It should be appreciated that in some arrangements, vias may be provided to connect more than two layers of a stack, e.g., stack 550, wherein one or more vias may be selectively and/or optionally removed along a laser dicing path (e.g., within a guard band). As a further example, the top metal layer component 506-7 is unperforated, meaning there is no opening through the top metal layer component 506-7 that is completely surrounded by a remaining portion of the metal layer component 506-7.

Figure 9:
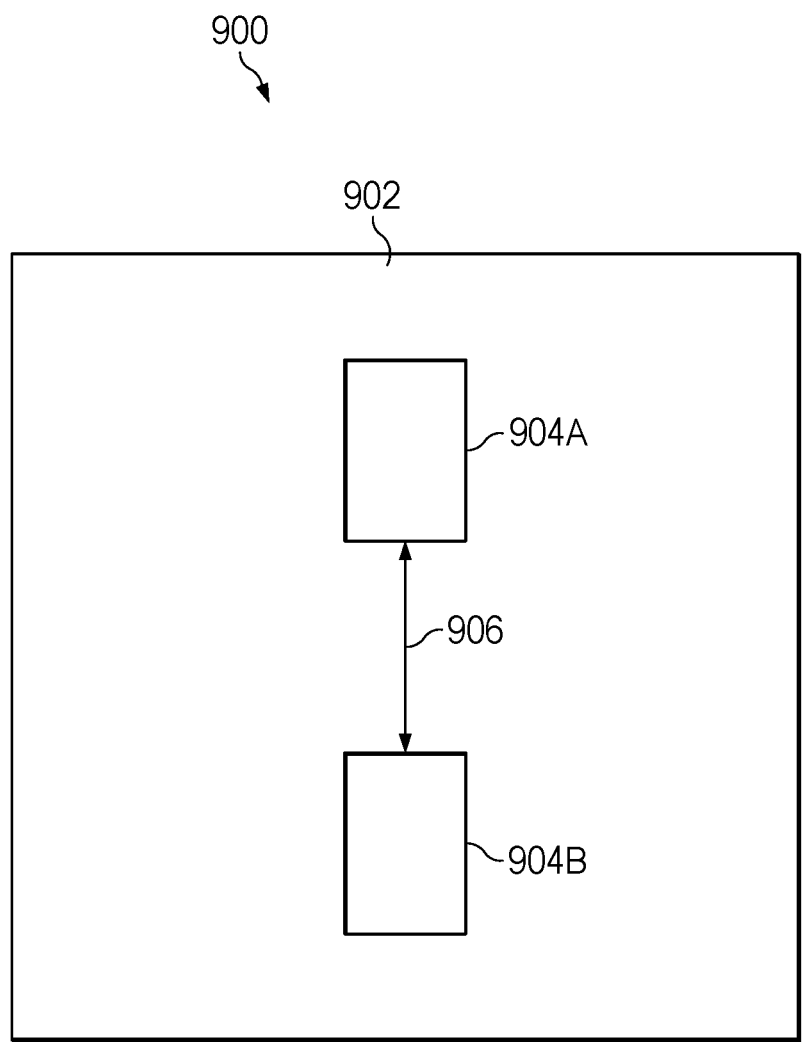
FIG. 9 depicts a top plan view of a TLM contact pad layer having a slotted design according to an example implementation.

Although some example implementations set forth above are illustrative of a metal stack having rectangular metal components at different levels, e.g., top level metal layers, intermediate and/or lower level metal layers, it should be appreciated that in some arrangements the metal components of a scribelane structure may be square in shape. Further, the thicknesses of the various metal components at different levels may vary depending on the design and/or process flow considerations. Still further, a top level metal component of a scribelane structure, e.g., a parametric test device structure, which may have a square shape, may be formed with a slotted design in some example implementations. In some arrangements, when the die size is less than a certain area (e.g., 800 μm×800 μm or thereabouts), it is desirable that the top-most metal level be slotted because below this threshold there may be insufficient mechanical strength during the post-laser die separation process to achieve effective separation of die adjacent to unslotted pads. Taking reference to FIG. 9, shown therein is a plan view of an example TLM contact pad layer 900 of a test pad, wherein the TLM layer comprises a metal frame 902 having slots 904A, 904B. In one arrangement, slots 904A, 904B may be separated by a central portion or member 906 that may be dimensioned to ensure (or at least increase the likelihood) of good electrical contact by a probe needle to the slotted TLM layer of the test pad. In some arrangements, central member 906 may comprise an area having a size that is a minimum fraction of the overall pad size. In an example implementation, central member 906 may have a square shape, e.g., 5.0 μm$^2$ or thereabouts. Skilled artisans will recognize that various design constraints of a slotted design, e.g., as set forth above with respect to FIG. 7, may also be applicable here.

Figure 2:
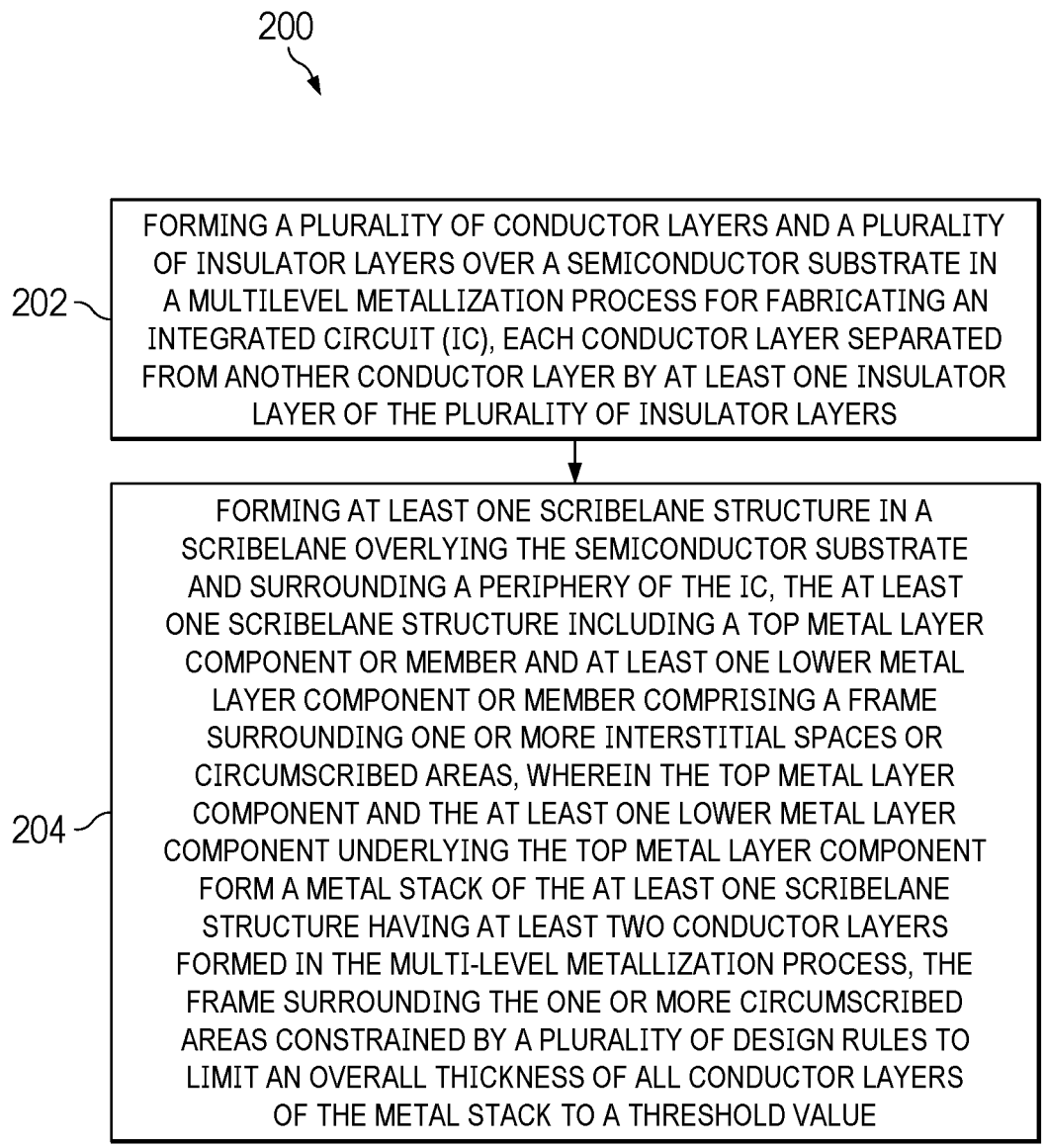
FIGS. 2 to 4 are flowcharts of representative methods according to some examples of the present disclosure.
Figure 3A:
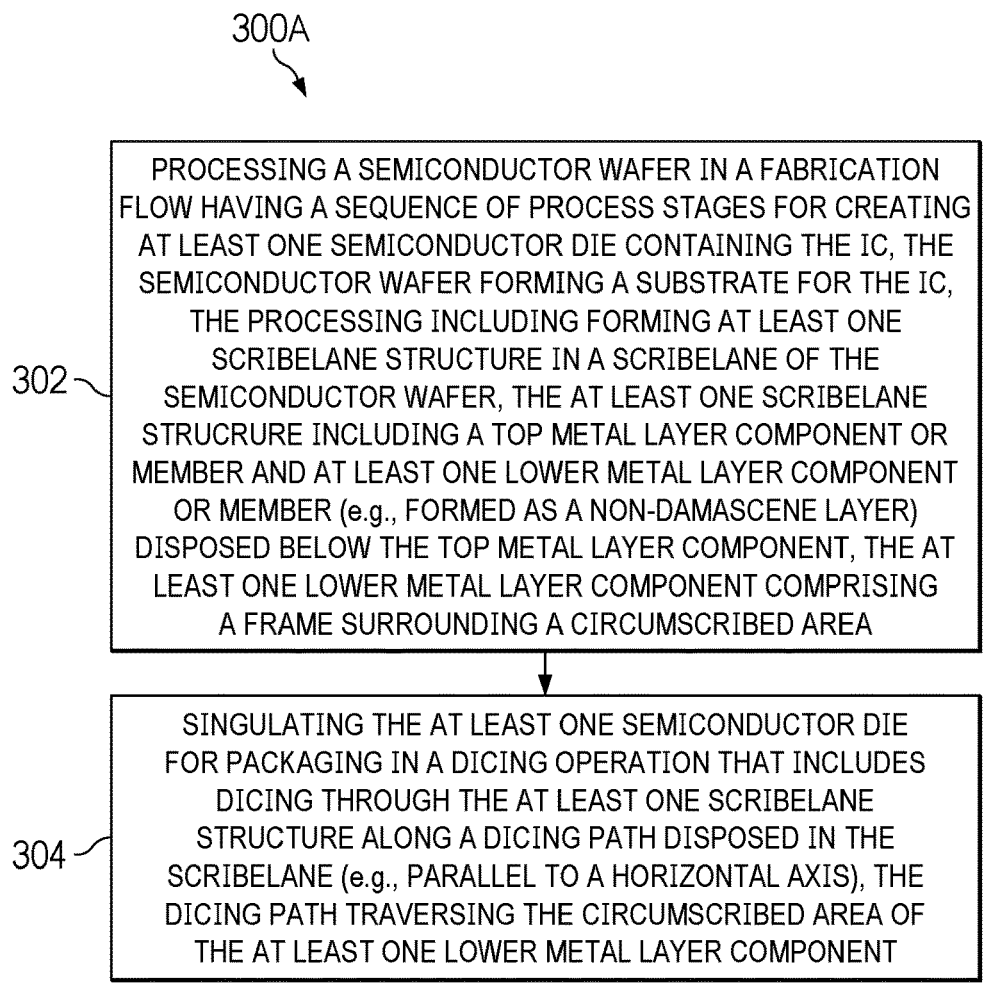
Figure 3B:
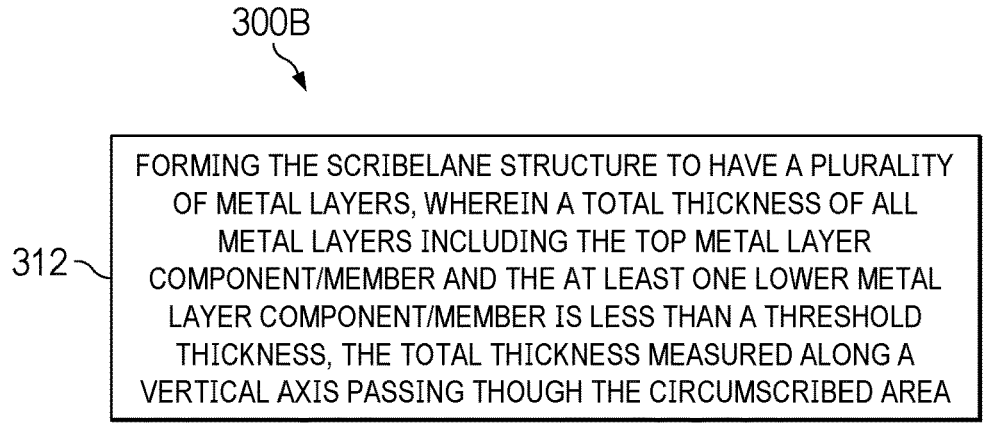
Figure 3C:
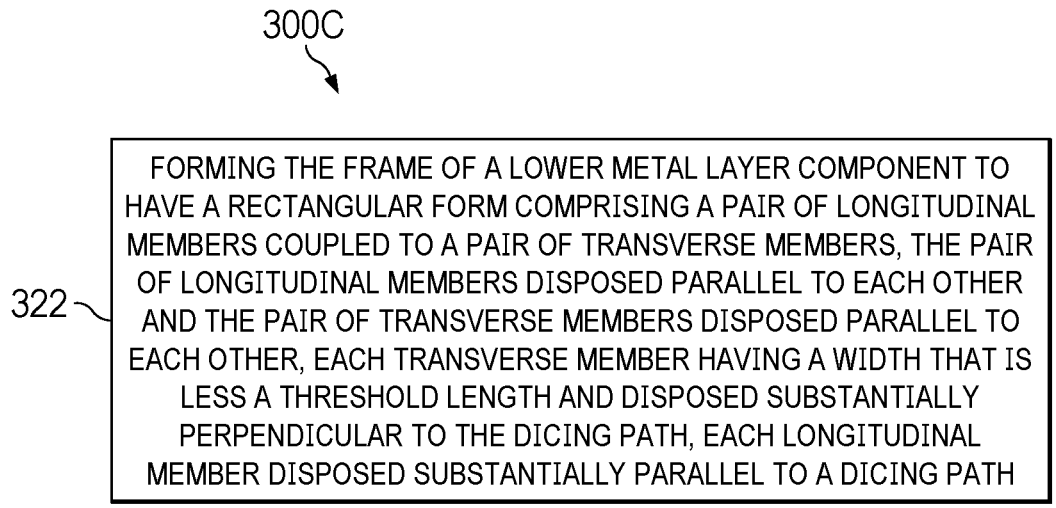
Figure 3D:
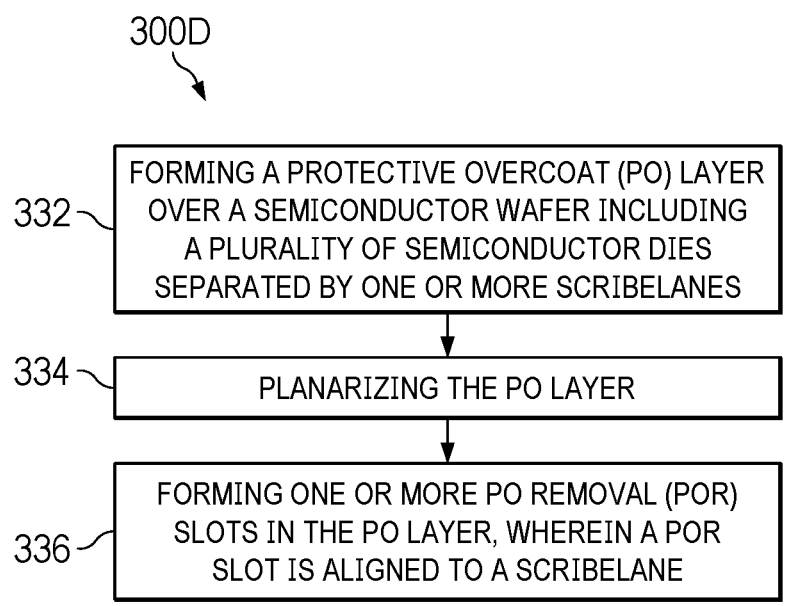
Figure 4:
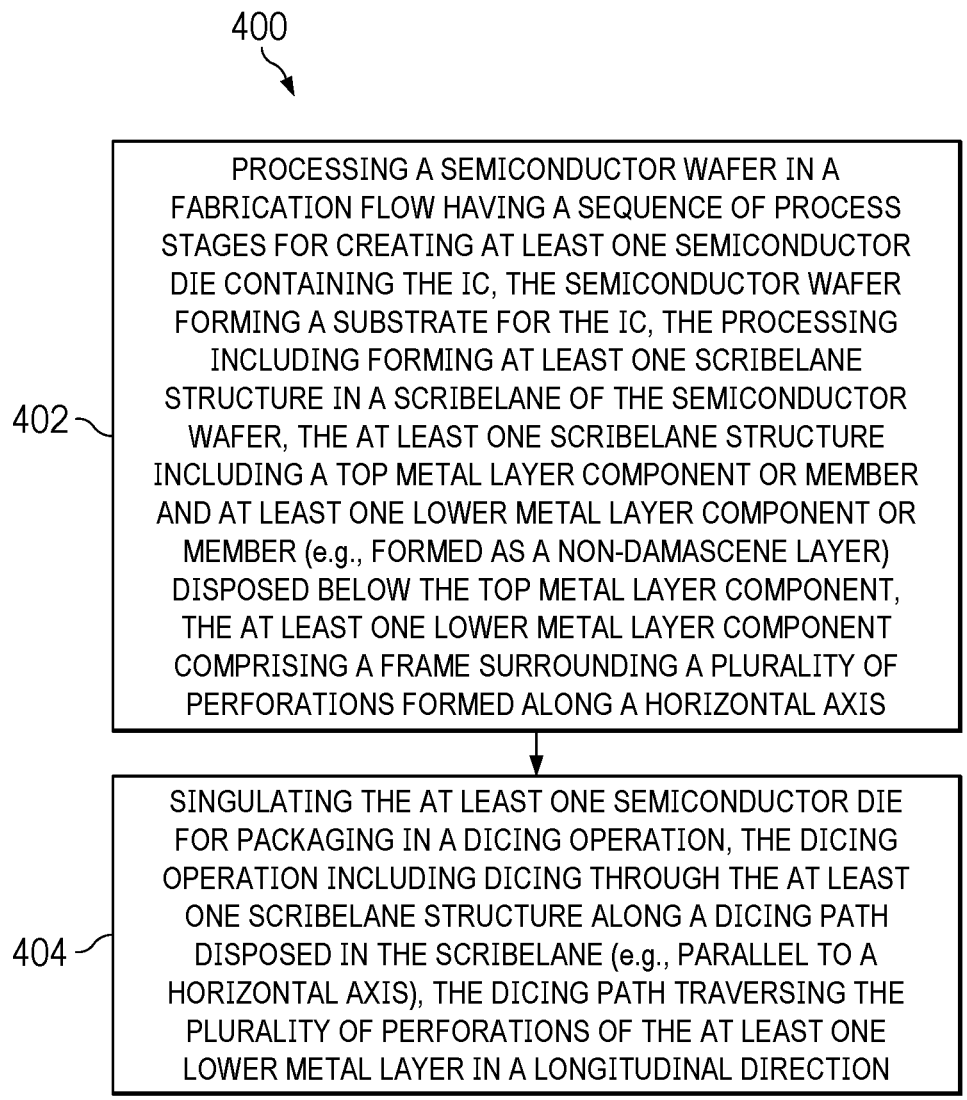

FIGS. 2 to 4 are flowcharts of representative methods according to some examples of the present disclosure, which may be combined and/or reconfigured in different arrangements for purposes of some example implementations. Example process 200 shown in FIG. 2 illustrates a fabrication method according to an implementation. At block 202, a plurality of conductor layers and a plurality of insulator layers may be formed over a semiconductor substrate in a multilevel metallization process for fabricating an integrated circuit (IC), wherein each conductor layer is separated from another conductor layer by at least one insulator layer of the plurality of insulator layers. At block 204, at least one scribelane structure may be formed in a scribelane overlying the semiconductor substrate and surrounding a periphery of the IC, wherein the at least one scribelane structure includes an upper metal layer component (e.g., a top metal layer component or member) and at least one lower metal layer component or member comprising a frame surrounding one or more interstitial circumscribed areas. In one arrangement, the top metal layer component and the at least one lower metal layer component underlying the top metal layer component may be configured to form a metal stack of the at least one scribelane structure having at least two conductor layers formed in the multilevel metallization process, wherein the frame surrounding the one or more interstitial circumscribed areas is constructed according to a plurality of design rules or constraints to limit an overall thickness of all conductor layers of the metal stack to a threshold value. In one arrangement, one or more conductor layers and associated metal layer components of the scribelane structure having a frame design may be formed in a non-damascene metallization process.

Example process 300A shown in FIG. 3A illustrates a fabrication method according to an implementation. At block 302, a semiconductor wafer may be processed in a fabrication flow having a sequence of process stages for creating at least one semiconductor die containing an integrated circuit (IC), the semiconductor wafer forming a substrate for the IC, wherein the processing includes forming at least one scribelane structure in a scribelane of the semiconductor wafer. In one arrangement, the at least one scribelane structure includes an upper metal layer component (e.g., a top metal layer component) and at least one lower metal layer component (e.g., formed as a non-damascene layer) disposed below the top/upper metal layer component. In one arrangement, the at least one lower metal layer component may comprise a hollow frame surrounding a circumscribed area aligned to a dicing path disposed in the scribelane. At block 304, the at least one semiconductor die may be singulated (e.g., for packaging) in a dicing operation (e.g., a laser dicing operation) that includes dicing through the at least one scribelane structure along the dicing path (e.g., parallel to a horizontal axis), the dicing path traversing or intersecting the circumscribed area of the at least one lower metal layer component. In one arrangement, the scribelane structure may be formed to have a plurality of metal layers, wherein a total metal stack thickness of all metal layers including the top metal layer component and the at least one lower metal layer component is less than a threshold thickness, the total thickness measured along a vertical axis passing through the circumscribed area, as set forth at block 312 of flow 300B shown in FIG. 3B. As described previously, the threshold total metal thickness may be process- and/or product-dependent, and may be empirically determined in an example implementation to optimize separation yields associated with the dicing operation. In one arrangement, the frame of a lower metal layer component may be formed to have a rectangular form comprising a pair of longitudinal members coupled to a pair of transverse members, the pair of longitudinal members disposed parallel to each other and the pair of transverse members disposed parallel to each other, wherein each transverse member has a width that is less a threshold length and disposed substantially perpendicular to the dicing path, as set forth at block 322 of flow 300C shown in FIG. 3C.

In one arrangement of a fabrication method, a protective overcoat (PO) layer may be formed over a semiconductor process wafer including a plurality of semiconductor dies separated by one or more scribelane, as set forth at block 332 of flow 300D shown in FIG. 3D. In some example implementations, the PO layer may be optionally planarized (block 334). At block 336, one or more PO removal (POR) slots may be formed in the PO layer, wherein a POR slot may be aligned to a scribelane (block 336).

Example process 400 shown in FIG. 4 illustrates a fabrication method according to an implementation. At block 402, a semiconductor wafer may be processed in a fabrication flow having a sequence of process stages for creating at least one semiconductor die containing an IC, the semiconductor wafer forming a substrate for the IC, wherein the processing includes forming at least one scribelane structure in a scribelane of the semiconductor wafer having a top metal layer component and at least one lower metal layer component (e.g., formed as a non-damascene layer) disposed below the top metal layer component. In one arrangement, the at least one lower metal layer component may comprise a perforated sheet having a plurality of perforations aligned to the dicing path. At block 404, the at least one semiconductor die is singulated (e.g., for packaging) in a dicing operation (e.g., a laser dicing operation), the dicing operation including dicing through the at least one scribelane structure along a dicing path traversing the plurality of perforations of the at least one lower metal layer in a longitudinal direction.

Figure 8A:
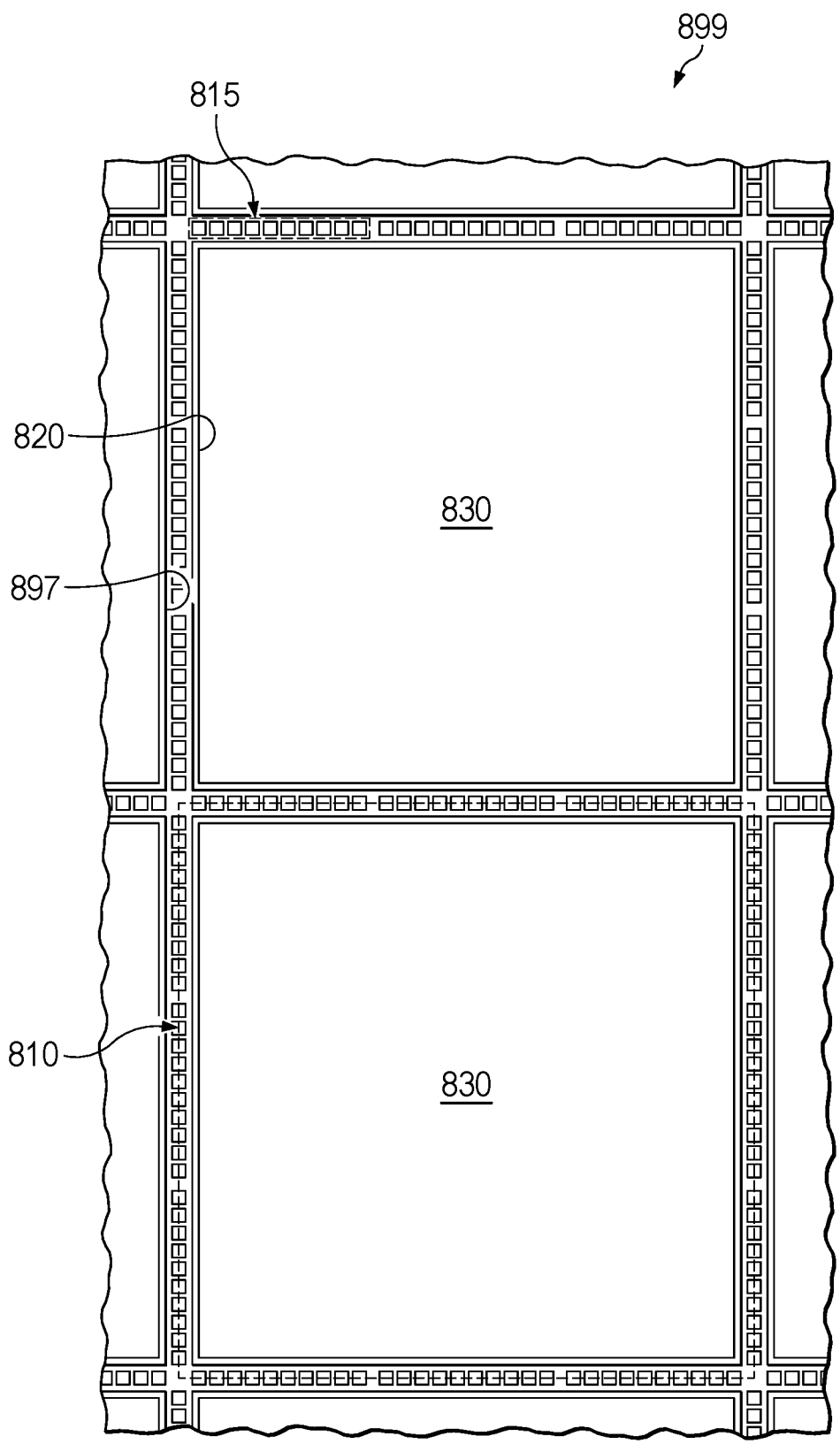
FIGS. 8A-8G depict additional examples according to some implementations.
Figure 8B:
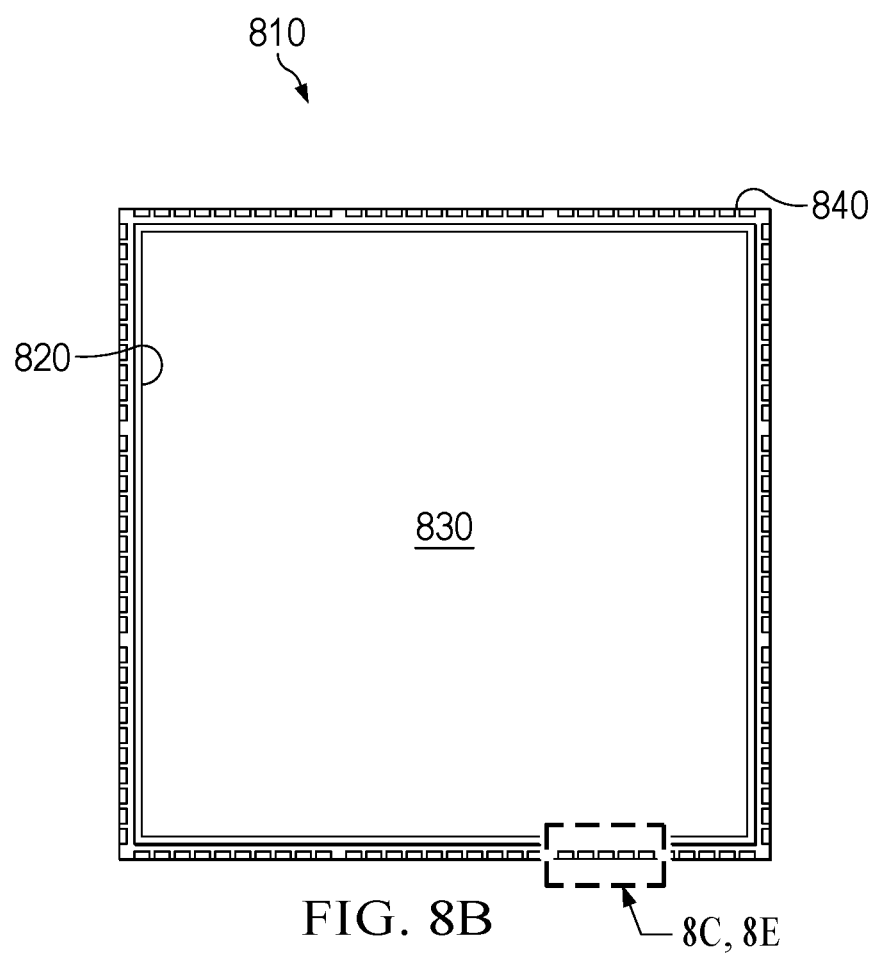
Figure 8C:
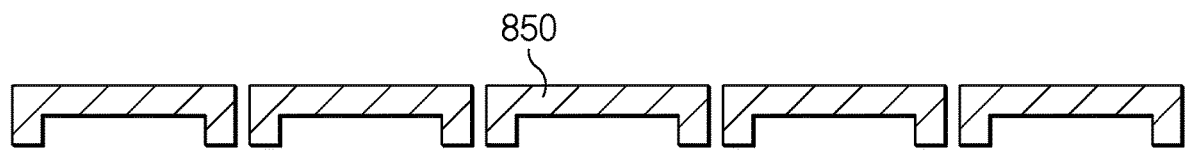
Figure 8D:
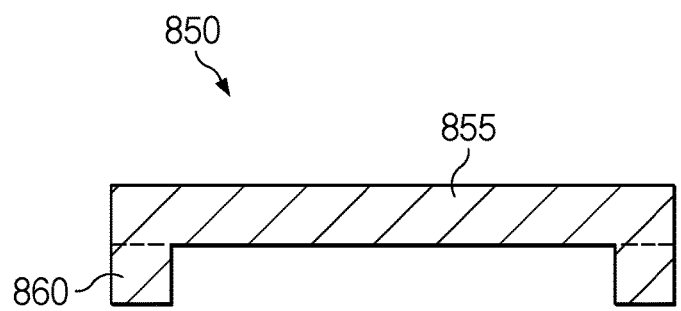

FIGS. 8A-8G depict some examples of device dies and portions thereof wherein example scribelane frame structures according to some implementations are illustrated. FIG. 8A shows a top plan view of a wafer portion 899 having two device dies 810 separated by a scribelane 897. As illustrated, device die 810 has a device area 830 surrounded by a scribe seal 820. One or more parametric test devices 815 may be disposed in scribelane 897. FIG. 8B depicts a top plan view of a singulated device die and a plurality of scribelane frame structures formed from dicing through the parametric test devices 815 according to some examples of the present disclosure. In one arrangement, device die 810 has a cut edge or singulated die edge 840, which may be formed by a saw edge or laser used to singulate the device die 810 formed on a common substrate such as silicon wafer portion 899. Cut edge 840 along the dicing path may intersect or traverse through the parametric test devices 815, as described previously. Additional details relating to cut portions of parametric test devices having an example frame arrangement are shown in FIGS. 8C and 8D. FIG. 8C is illustrative of a plurality of frame portions 850. Frame portion 850 may be a residual portion (e.g., a bisected portion) at any metal level of an example scribelane frame structure formed in scribelane 897 adjacent device area 830 (and scribe seal 820 if included) according to an example arrangement set forth above, wherein the scribelane has been partially removed in a dicing operation. In some arrangements, scribe seal 820 may include a plurality of conductor layers and conductive vias extending through one or more insulator layers disposed between the conductor layers (not explicitly shown in this FIG.). In some arrangements, scribe seal 820 may form a vertical conductor structure that surrounds device area 830, wherein the vertical conductor structure may be covered by a passivation layer (not explicitly shown in this FIG.). Regardless of how a scribe seal 820 is fabricated, frame portion 850 may comprise a first metal segment 855 and at least one second metal segment 860 in an example implementation depicted in FIG. 8D. As noted previously, first metal segment 860 may be disposed substantially parallel to scribe seal 820, which in turn may be disposed substantially parallel to a dicing path. In some arrangements, second metal segment(s) 860 may be disposed substantially perpendicular to the dicing path, e.g., extending away from first metal segment 855 to the cut edge 840. In one example implementation, where two second metal segments 860 are provided, they may each be disposed at opposite ends of the first metal segment 855, respectively.

Skilled artisans will appreciate that various other orientations of first and second metal segments 855, 860 are possible in additional and/or alternative arrangements.

Figure 8E:
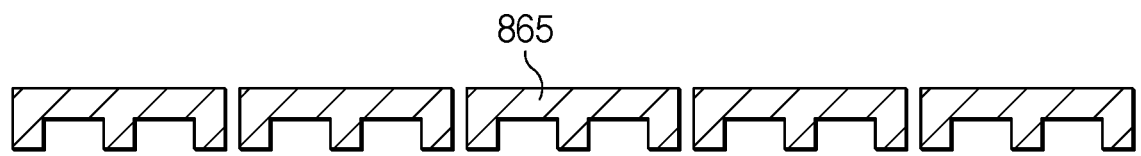
Figure 8F:
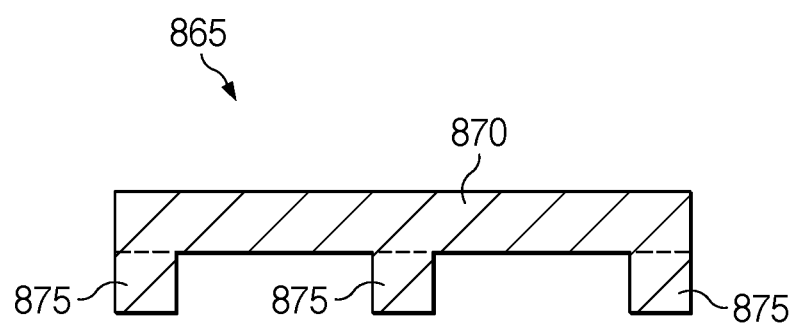
Figure 8G:
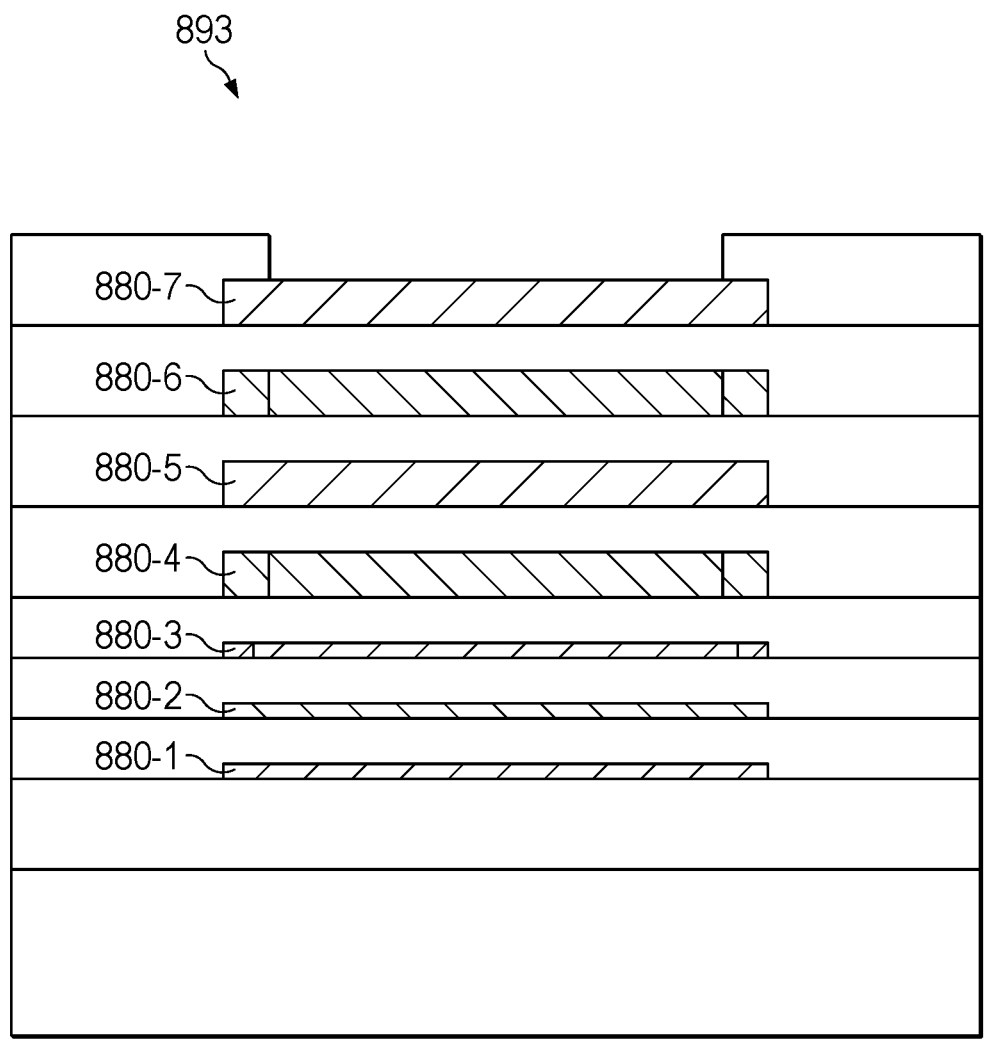

FIG. 8E depicts a frame portion 865 of a TLM layer of a scribelane parametric test device, wherein the TLM layer has a slotted arrangement. FIG. 8F illustrates additional details with respect to the slotted frame portion 865, wherein a first metal segment 870 is disposed substantially parallel to scribe seal 820 and a plurality of second metal segments 875 extend substantially perpendicularly therefrom to a cut die edge. FIG. 8G depicts a cross-sectional view of a multilevel stack structure 893 having a plurality of metal layers 880-1 to 880-7, wherein layers 880-3, 880-4 and 880-6 are shown as having a hollow frame structure, similar to the perspective view of stack 550 shown in FIG. 5. Metal layer 880-7 is operable as a TLM layer, which in some examples may be about two to three times the thickness of certain lower level layers, e.g., layers 880-1, 880-2, 880-3. In some example implementations, TLM layer 880-7 may have a thickness of about 1-3 µm.

At least some examples are described herein with reference to one or more block diagrams and/or flowchart illustrations. It is understood that such diagrams and/or flowchart illustrations, and combinations of blocks in the block diagrams and/or flowchart illustrations, are susceptible to various modifications, variations and alterations, etc. In at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, such as, e.g., "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An integrated circuit (IC), comprising:
a semiconductor substrate;
conductor layers and insulator layers overlying the semiconductor substrate, at least one of the conductor layers located between adjacent conductor layers by at least one insulator layer of the insulator layers; and
a scribelane overlying the semiconductor substrate and surrounding a die area, the scribelane including:
a scribelane structure formed in the scribelane, the scribelane structure including:
an upper metal layer member; and
a lower metal layer member between the upper metal layer member and the semiconductor substrate, the lower metal layer member comprising a frame portion including a first metal segment running parallel to a scribe seal surrounding the die area and at least one second metal segment extending from the first metal segment away from the scribe seal.

2. The IC as recited in claim 1, wherein the lower metal layer member includes two second metal segments, each extending from the first metal segment away from the scribe seal.

3. The IC as recited in claim 2, wherein the two second metal segments are disposed at opposite ends of the first metal segment, respectively.

4. The IC as recited in claim 2, wherein the two second metal segments each extend perpendicularly from the first metal segment.

5. The IC as recited in claim 1, wherein the lower metal layer is a non-damascene metal layer.

6. The IC as recited in claim 1, wherein the upper metal layer member and the lower metal layer member are located in a stack of metal layer members, and wherein a total metal stack thickness of the stack of metal layer members is no greater than about 4.2 μm.

7. The IC as recited in claim 1, wherein an area circumscribed by the frame portion is substantially rectangular, the circumscribed area having an interstitial width of about 5.0 μm to 15.0 μm, the interstitial width measured along a horizontal axis perpendicular to the scribe seal.

8. The IC as recited in claim 1, wherein the first metal segment of the frame portion is disposed substantially parallel to the scribe seal and the second metal segment is disposed substantially perpendicular to the scribe seal, the second metal segment having a width that is less than a width of the first metal segment.

9. The IC as recited in claim 1, wherein the first metal segment of the frame portion is disposed substantially parallel to the scribe seal and the second metal segment is disposed substantially perpendicular to the scribe seal, the second metal segment having a width that is no greater than about 10.0 μm.

10. The IC as recited in claim 1, further comprising one or more conductive vias directly connected to the upper metal layer member and the lower metal layer member, the one or more conductive vias positioned along the first metal segment.

11. A method of fabricating an integrated circuit (IC), the method comprising:
processing a semiconductor wafer in a fabrication flow having a sequence of process stages for creating a plurality of semiconductor dies each containing an instance of the IC including a scribe seal, the semiconductor wafer providing a substrate for the IC, the processing including forming a scribelane structure between two adjacent instances of the ICs, the scribelane structure including an upper metal layer member and a lower metal layer member disposed between the upper metal layer member and the semiconductor wafer, the lower metal layer member comprising a frame surrounding a circumscribed area; and
singulating at least one semiconductor die in a dicing operation, the dicing operation including cutting through the scribelane structure along a dicing path that intersects the circumscribed area along a path parallel to nearest sides of the two adjacent instances of the IC.

12. The method as recited in claim 11, wherein the lower metal layer member is a non-damascene metal layer.

13. The method as recited in claim 11, wherein the scribelane structure is formed to have a plurality of metal layers, a total metal stack thickness of all metal layers including the upper metal layer member and the lower metal layer member being no greater than about 4.2 μm.

14. The method as recited in claim 11, wherein the scribelane structure is formed to have a length no less than about 10 μm measured along the dicing path.

15. The method as recited in claim 11, wherein the frame comprises a frame portion having a first metal segment and a second metal segment, and wherein the first metal segment is disposed substantially parallel to the scribe seals and the second metal segment having a width that is less than a width of the first metal segment.

16. The method as recited in claim 11, further comprising:
forming a protective overcoat (PO) layer over the plurality of semiconductor dies;
planarizing the PO layer; and
forming a PO removal (POR) slot in the PO layer, the POR slot aligned to the scribe seal.

17. An integrated circuit (IC), comprising:
a semiconductor substrate;
a scribe seal enclosing a device area of the integrated circuit;
an electronic device formed in or over the semiconductor substrate in the device area; and
a scribelane structure located outside the device area, the scribelane structure including a frame portion including a longitudinal member extending along a direction parallel to a nearest side of the scribe seal and a transverse member extending from the longitudinal member to a cut edge of the semiconductor substrate.

18. The IC as recited in claim 17, further comprising an unperforated metal layer over the frame portion, the transverse and longitudinal members comprising aluminum and the unperforated metal layer comprising damascene copper.

19. The IC as recited in claim 17, wherein the frame portion shares a common transverse member with an adjacent frame portion.

20. The IC as recited in claim 17, further comprising an unperforated metal layer over the frame portion and a plurality of inter-level vias connected between the unperforated metal layer and the longitudinal member, the transverse member not directly connected to any inter-level via.

* * * * *